United States Patent [19]

Blackham

[11] Patent Number: 4,994,803
[45] Date of Patent: Feb. 19, 1991

[54] RANDOM NUMBER DITHER CIRCUIT FOR DIGITAL-TO-ANALOG OUTPUT SIGNAL LINEARITY

[75] Inventor: Raymond C. Blackham, Penn Valley, Calif.

[73] Assignee: Hewlett-Packard Company, Palo Alto, Calif.

[21] Appl. No.: 442,278

[22] Filed: Nov. 27, 1989

[51] Int. Cl.$^5$ .............................................. H03M 1/20
[52] U.S. Cl. ..................................... 341/131; 341/140; 341/144
[58] Field of Search ............... 341/118, 130, 131, 138, 341/139, 140, 126, 144

[56] References Cited

U.S. PATENT DOCUMENTS 4,550,309 10/1985 Hiller et al. ........................ 341/131

OTHER PUBLICATIONS

Yamasaki; The Application of Large Amplitude Dither to the Quantization of Wide Range Audio Signals; Journal of the Acoustical Society of Japan; vol. 39, No. 7 Jul. 1983, pp. 452–462.

Primary Examiner—William M. Shoop, Jr.
Assistant Examiner—Howard L. Williams

[57] ABSTRACT

Distortion in a digital-to-analog converter (DAC) is eliminated by adding a digital random number to each sample of the digital signal, converting the sum into analog form, and subtracting from this analog sum the analog counterpart of the digital random number. The result is the analog counterpart to the input digital signal. The conversation of the summed digital signal and the random number into analog form can be performed by two conventional DACs. For any digital input sample, the output of each DAC is equally likely to contain any of the possible distortion errors produced by the DAC. (An exception is the most significant output bit of the DAC that processes the summed signal, an exception that may be handled by stripping off the most significant bit and applying it to a one-bit DAC.) The error signal at the output of each of the two DACs is thus a random sequence (i.e. noise) of DAC distortion errors. The time average of this noise signal is a small offset error which, if desired, can be removed by subsequent processing stages.

4 Claims, 1 Drawing Sheet

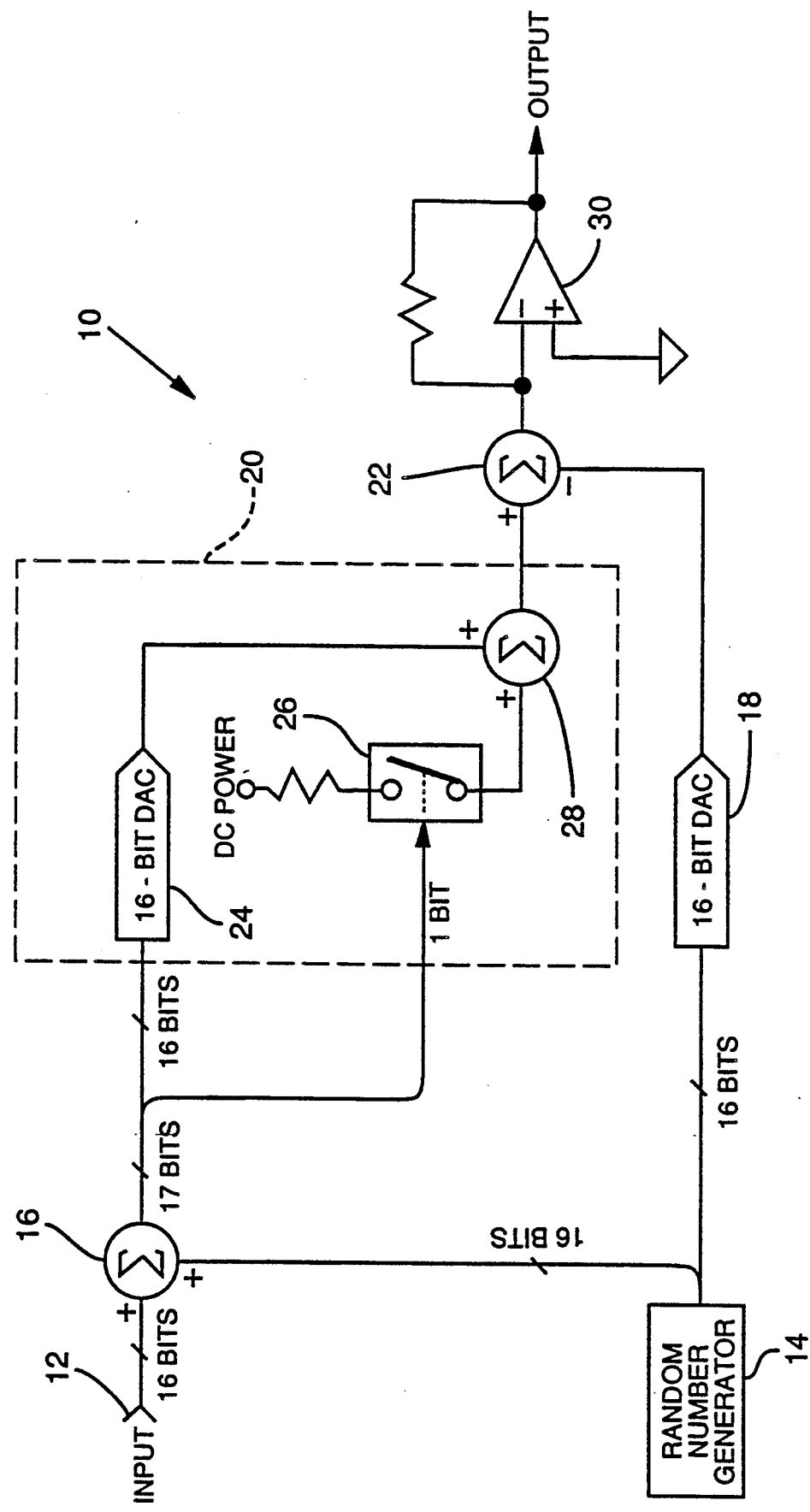

RANDOM NUMBER DITHER CIRCUIT FOR DIGITAL-TO-ANALOG OUTPUT SIGNAL LINEARITY

FIELD OF THE INVENTION

The present invention relates to digital-to-analog conversion circuitry, and more particularly to a method and apparatus for linearizing the output of a digital-to-analog converter.

BACKGROUND AND SUMMARY OF THE INVENTION

Digital-to-analog converters (DACs) find application in myriad electronic applications. In some applications, it is important that the conversion from digital to analog be highly accurate. Exemplary are signal analysis instruments that must produce highly accurate analog excitation signals from corresponding digital signal data. In most such applications, conversion errors that are a function of the input digital data (hereafter referred to as distortion) are much more important than errors that are uncorrelated (hereafter referred to as noise). The noise portion of any conversion error can always be reduced by averaging the waveform over time. The distortion portion of the error, however, cannot.

To achieve low distortion D/A conversion, resort must usually be made to precision DACs that have been fabricated with finely matched components. An alternative approach is to quantify the distortion error of a particular converter at all possible input signal conditions and then to implement a correction circuit that compensates for the circuit's known error. Both approaches, however, are expensive and unsuitable for large volume production.

The present invention achieves accuracy comparable to that achieved with the precision approaches, but employs readily available off-the-shelf components.

According to the present invention, the input signal to be applied to a conventional DAC is first processed so that its value is uncorrelated with that of the unprocessed input signal. This processing can be effected by adding a digital random, or pseudorandom number to the input digital signal. The digital random number is then converted into analog form by a first DAC, and the processed sum is converted into analog form by a second DAC. An analog subtraction circuit then subtracts the analog version of the random number from the analog version of the processed sum. The difference is the analog counterpart to the original digital input signal.

For any digital input sample, the output of the first DAC is equally likely to contain any of the possible distortion errors produced by that DAC. The same is true for the output of all except the most significant bit of the second DAC. The most significant bit has some correlation to the input signal. To segregate the effects of this bit, it is desirably stripped off and applied to a third, one-bit DAC. This leaves the outputs of the first and second DACs both uncorrelated with the original digital input signal, meaning their output error signals are random sequences (i.e. noise) composed of DAC distortion errors. The ensemble of this noise signal is a small constant, termed an offset error. If desired, this small offset error can be removed by subsequent processing stages.

The foregoing and additional features and advantages of the present invention will be more readily apparent from the following detailed description thereof, which proceeds with reference to the accompanying Figure.

BRIEF DESCRIPTION OF THE FIGURE

The Figure is a schematic block diagram of a DAC linearizing c according to one embodiment of the present invention.

DETAILED DESCRIPTION

Referring the Figure, a DAC linearizing circuit 10 according to one embodiment of the present invention includes a digital data signal input 12, a random noise generator 14, a digital adder 16, first and second digital-to-analog converters (DACs) 18, 20, and an analog combining circuit 22.

In operation, a digital signal to be converted into analog form is applied to the digital signal input 12. In a representative embodiment, this signal may be 16 bits in width, although the invention is not so limited. The adder 16 adds to each sample of the input digital signal a digital random number of equal width, here 16 bits, from the random number generator 14. Since both signals applied to the adder have 16 bits, the output sum is a 17 bit value.

The system next converts the summed digital signal and the digital random number into analog signals using DACs 20 and 18, respectively. Finally, the analog combining circuit 22 subtracts from the analog version of the summed signal the analog version of the random signal to produce as its output signal an analog version of the input digital data signal.

In greater detail, the illustrated second DAC 20 here comprises a 16-bit DAC 24 that operates in conjunction with a 1-bit DAC (or analog switch) 26. In this arrangement, the most significant bit of the 17 bit digital sum output by the adder 16 is stripped off and is applied to the 1-bit DAC 26. The remaining 16 bits are applied to the 16-bit DAC 24. The outputs of these two DACs are analog current signals that are summed by an analog summing circuit 28 to produce an analog output signal representative of the 17 bit summed digital signal. (It will be recognized that in other embodiments, a 17-bit DAC may be used if the correlation of the most significant output bit to the original digital input signal [discussed below] is addressed otherwise or is ignored.)

The output of the analog summing circuit 28 is applied to one input of the analog combining circuit 22. To the second input of this combining circuit is applied an analog current signal produced by the DAC 18 (i.e. an analog version of the digital random number). The resulting difference signal is applied to an operational amplifier 30 that produces as its output signal an analog voltage signal. This voltage output signal is the analog counterpart to the digital data input signal.

For any digital input sample, the output of each of the two 16-bit DACs 18, 24 is equally likely to contain any of the possible distortion errors produced by that DAC. The error signal at the output of each of these DACs is thus a random sequence (i.e. noise) of DAC distortion errors. The ensemble of this noise signal is a small constant, termed an offset error. Thus, on average, only an offset error and uncorrelated noise can be added to the analog output signal by the 16-bit DACs 18, 24 for any given output sample. This is true for settling errors as well. Since consecutive random numbers from random number generator 14 are uncorrelated to the input samples and to each other, this error is also uncorrelated noise and has a constant average value.

The output of the 1-bit DAC 26 is somewhat correlated to the input digital sequence. However, since it is a one bit DAC, only gain and offset errors are possible. Second and higher order distortion errors are not possible for a perfectly stable 1-bit DAC (e.g. one that doesn't drift with temperature and time). If settling errors, such as slew rate, are considered, a nonlinear term can appear, but will only cause a slight linear filtering of the signal if the settling errors in both directions are matched (e.g. slew rate the same in both directions). Such linear filtering modifies the signal in a manner that can readily be corrected by a linear analog or digital filter.

In sum, the only errors appearing in the analog output signal are gain errors, offset errors, artifacts of linear filtering (due to settling errors), and uncorrelated noise. The output is therefore a random variable with a mean that is a linear function of the input (e.g. with no second or higher order terms in its polynomial expansion), coupled with a linear filtering effect. The error terms can be further reduced in amplitude by averaging or other forms of linear filtering if desired.

Having described and illustrated the principles of my invention with reference to a preferred embodiment, it should be apparent that the invention can be modified in arrangement and detail without departing from such principles. Accordingly, I claim as my invention all such modifications as may come within the scope and spirit of the following claims and equivalents thereto.

I claim:

1. A method of low distortion digital-to-analog conversion comprising the steps:

providing an N bit sample of an input digital data signal;

generating an N bit digital random number;

adding said N bit sample and said N bit random number to yield an N+1 bit combined digital number;

converting said N bit random number into a first analog signal;

converting said N+1 bit combined digital number into a second analog signal by:

converting the most significant bit of said N+1 bit combined digital number into a third analog signal using a one-bit D/A converter;

converting the N least significant bits of said N+1 bit combined digital number into a fourth analog signal using an N-bit D/A converter; and summing the third and fourth analog signals to yield the second analog signal;

wherein the use of separate one-bit and N-bit D/A converters instead of a single N+1 bit D/A converter reduces correlation between the third and fourth output signals; and subtracting said first analog signal from the second analog signal to produce an analog output signal corresponding to the input digital data sample.

2. The method of claim 1 in which the generating step comprises generating an N bit digital random number wherein each of the N bits of the digital random number is uncorrelated with all of the other N bits of the digital random number.

3. The method of claim 1 that further includes averaging the analog output signal over time.

4. The method of claim 1 that further includes removing an offset error from the analog output signal.

* * * * *